United States Patent
Wen et al.

(10) Patent No.: US 12,204,824 B2
(45) Date of Patent: Jan. 21, 2025

(54) COMPILER PLUGIN FOR SPECIAL-PURPOSE COMPUTER PROCESSORS WITH DUAL SUPPORT FOR DESIGN VERIFICATION AND RELEASE PACKAGING

(71) Applicant: Fortinet, Inc., Sunnyvale, CA (US)

(72) Inventors: Shushan Wen, Pleasant Hill, CA (US); Linna Mai, San Jose, CA (US)

(73) Assignee: Fortinet, Inc., Sunnyvale, CA (US)

( * ) Notice: Subject to any disclaimer, the term of this patent is extended or adjusted under 35 U.S.C. 154(b) by 943 days.

(21) Appl. No.: 17/138,914

(22) Filed: Dec. 31, 2020

(65) Prior Publication Data

US 2022/0207210 A1    Jun. 30, 2022

(51) Int. Cl.
*G06F 30/20* (2020.01)
*G06F 8/30* (2018.01)
*G06F 9/54* (2006.01)

(52) U.S. Cl.
CPC ............. *G06F 30/20* (2020.01); *G06F 8/37* (2013.01); *G06F 9/547* (2013.01)

(58) Field of Classification Search
CPC ............ G06F 30/20; G06F 8/37; G06F 9/547
USPC .......................................................... 703/21
See application file for complete search history.

(56) References Cited

U.S. PATENT DOCUMENTS

| | | | | |
|---|---|---|---|---|
| 5,535,815 A * | 7/1996 | Hyman | ................ | G05D 23/024 165/277 |
| 7,177,311 B1 * | 2/2007 | Hussain | ................... | H04L 45/00 370/395.32 |
| 8,904,320 B2 * | 12/2014 | Korthikanti | ............. | G06F 30/30 716/106 |
| 9,432,284 B2 * | 8/2016 | Goyal | ................. | H04L 47/2441 |
| 9,965,419 B1 * | 5/2018 | Wen | ......................... | G06F 5/06 |
| 10,073,938 B2 * | 9/2018 | Arunagiri | ........... | G06F 30/3308 |
| 10,819,682 B1 * | 10/2020 | Deepak | ............... | H04L 63/0236 |
| 10,984,158 B1 * | 4/2021 | Wen | ..................... | G06F 16/9024 |
| 2003/0093764 A1 * | 5/2003 | Devins | .................... | G06F 30/33 716/106 |

(Continued)

OTHER PUBLICATIONS

Callanan et al. ("Compiler-Assisted Software Verification Using Plug-Ins", IEEE, 2006, pp. 1-8) (Year: 2006).*

(Continued)

*Primary Examiner* — Iftekhar A Khan
(74) *Attorney, Agent, or Firm* — Law Office of Dorian Cartwright; Dorian Cartwright

(57) ABSTRACT

A compiler (CPL) plugin comprises a TC to, responsive to a new DV test, read configuration settings and selects appropriate plugin processes based on the configuration settings. An API interface can generate images that control the special purpose processor during a stage of a plurality of stages for a CPL-related design verification (DV) test and call selected plugin processes. A common compiler module comprising a common function codebase. A DV specialized support module comprising a DV function only codebase, wherein the DV has access to the common compiler module. An RP specialized support module can comprise an RP function only codebase, wherein the codebase is common for both DV and RP, and wherein top-level APIs are designed for both DV and RP. Responsive to completing the DV test, TC disables the plugins and injects traffic for the DV test, and wherein TC reports testing results.

15 Claims, 5 Drawing Sheets

Flowchart of a CPL related DV test

(56) References Cited

U.S. PATENT DOCUMENTS

| | | | | |
|---|---|---|---|---|
| 2009/0222777 | A1* | 9/2009 | Shen | G06F 30/33 |
| | | | | 716/136 |
| 2011/0096506 | A1* | 4/2011 | Huang | H01L 25/0657 |
| | | | | 361/729 |
| 2012/0084759 | A1* | 4/2012 | Candea | G06F 9/45504 |
| | | | | 717/134 |
| 2012/0136635 | A1* | 5/2012 | Hung | G06F 7/582 |
| | | | | 703/2 |
| 2012/0278675 | A1* | 11/2012 | Qiang | G06F 30/39 |
| | | | | 714/739 |
| 2012/0311121 | A1* | 12/2012 | Shafrir | H04L 69/22 |
| | | | | 709/223 |
| 2013/0091382 | A1* | 4/2013 | Segall | G06F 11/3684 |
| | | | | 714/E11.178 |
| 2014/0334321 | A1* | 11/2014 | Sanivsky | H04L 47/2441 |
| | | | | 370/252 |
| 2015/0128267 | A1* | 5/2015 | Gupta | H04L 63/145 |
| | | | | 726/23 |
| 2016/0285992 | A1* | 9/2016 | Katsev | H04L 67/5682 |
| 2016/0378646 | A1* | 12/2016 | Zare | G06F 11/3688 |
| | | | | 714/38.1 |
| 2019/0340327 | A1* | 11/2019 | Ghosh | G06F 30/20 |
| 2019/0370158 | A1* | 12/2019 | Rivoir | G06F 11/3672 |
| 2020/0104443 | A1* | 4/2020 | Biswas | G06F 30/30 |
| 2021/0067453 | A1* | 3/2021 | Cui | H04L 43/0882 |
| 2021/0204152 | A1* | 7/2021 | Vasudevan | H04L 41/147 |
| 2022/0207210 | A1* | 6/2022 | Wen | G06F 30/20 |

OTHER PUBLICATIONS

Gorsky et al. (Orlando Tools: Supporting High-performance Computing in Distributed Environments, 2020, IEEE, pp. 1-6) (Year: 2020).*

Hall et al. (Secure ASIC Architecture for Optimized Utilization of a Trusted Supply Chain for Common Architecture A&D Applications , 2017, GlobalFoundries, pp. 492-495) (Year: 2017).*

* cited by examiner

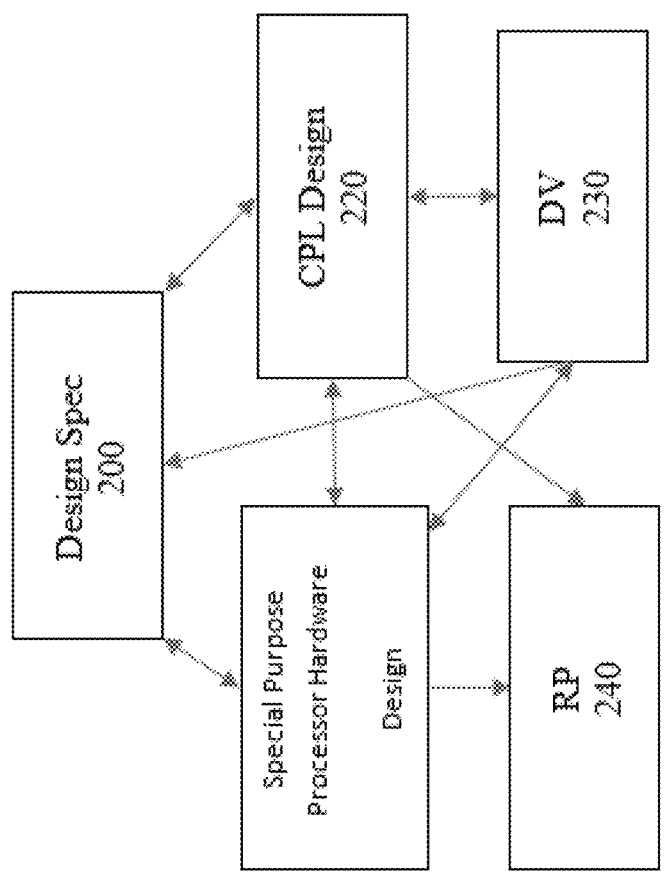
Fig 1. CPL design in the design and verification system

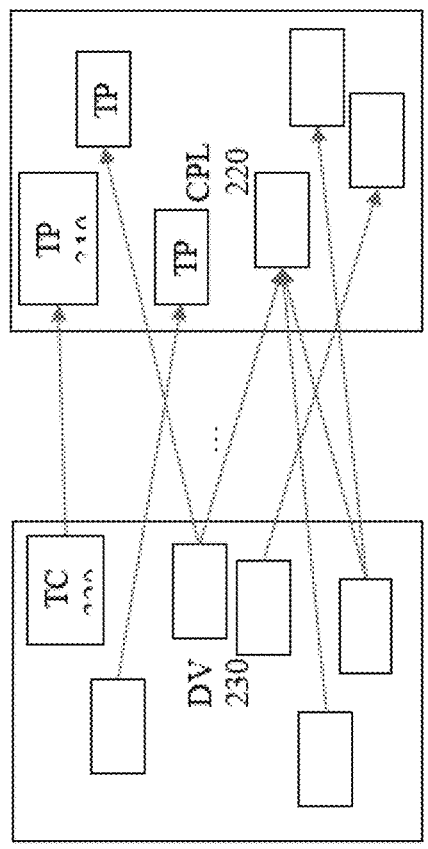
Fig 3. Example of connections between DV and CPL
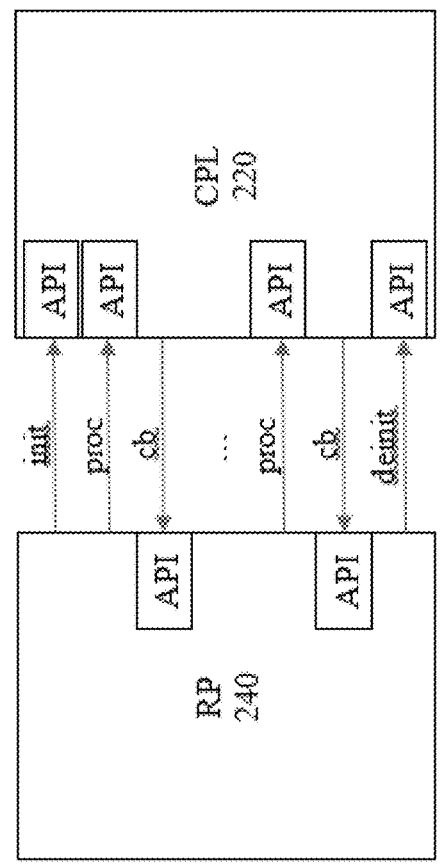
Fig 2. Example API calls between RP and CPL

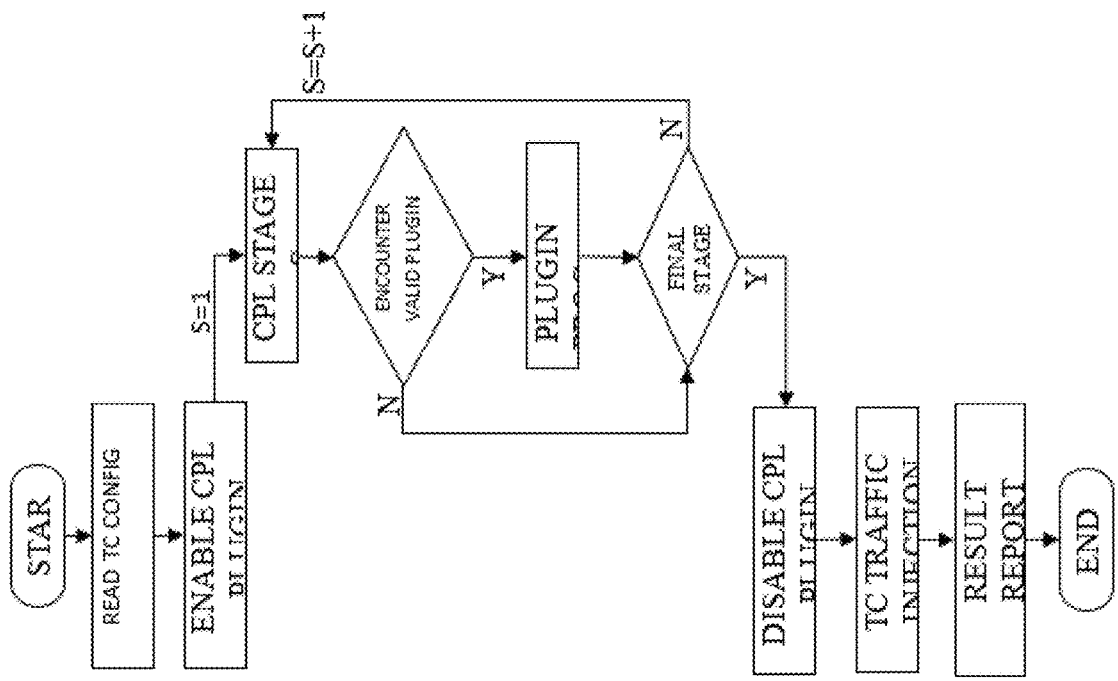
Fig 4. Flowchart of a CPL related DV test

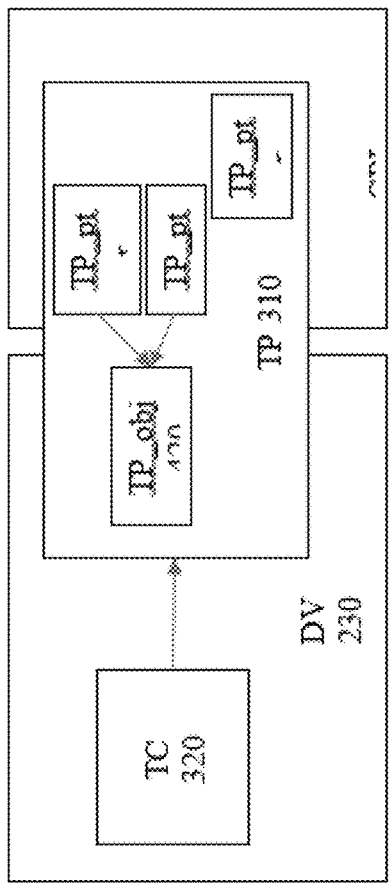
Fig 5. Use TP_obj and TP_ptr to implement a TP
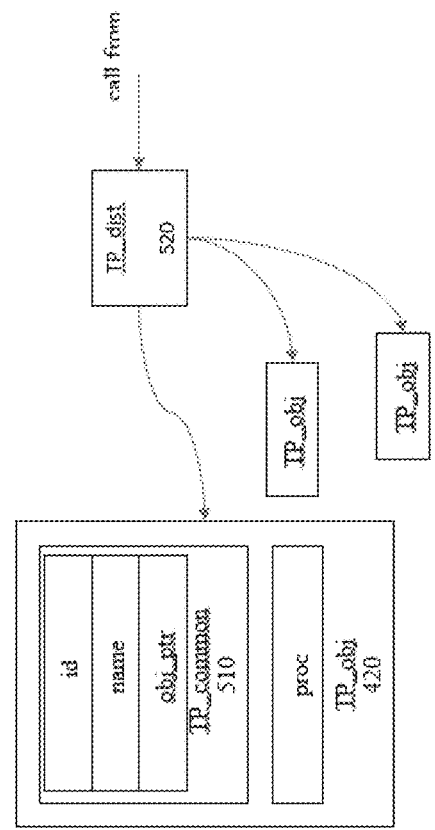
Fig 6. TP_dist and an example of components of

```
TP_dist:
switch (TP_ptr->id) {
case id1:
    proc1(TP_ptr->obj, args);
    // proc of TP_obj with id1
    break;
case id2:
    proc1(TP_ptr->obj, args);
    // proc of TP_obj with id2
    break;
...
```

```
CPL:
if (TP_ptr is valid) {
    TP_dist(TP_ptr, args);
}
```

Fig 7. Pseudo code of TP_dist and its usage in CPL

```
TP_enable(obj_ptr, id) {
TP_obj[id]->id = id;
TP_obj[id]->obj_ptr = obj_ptr;
obj_ptr->TP_ptr = TP_obj[id];
```

```
disable(id){
isable TP_obj[id]->obj_ptr->TP_ptr;
isable TP_obj[id];
```

Fig 8. Pseudo code of TP_enable and TP_disable

COMPILER PLUGIN FOR SPECIAL-PURPOSE COMPUTER PROCESSORS WITH DUAL SUPPORT FOR DESIGN VERIFICATION AND RELEASE PACKAGING

FIELD OF THE INVENTION

The invention relates generally to computer processors, and more specifically, to a processor compiler plugin for supporting execution for a special-purpose computer processor during design verification in design verification and resource packaging.

BACKGROUND

The compiler (CPL) is a critical part of the special-purpose processor (such as certain types of network processor) design, verification, and distribution. In addition to its own complexity and flexibility to support features of the processor, CPL also needs to be optimized for memory footprint, compilation speed, and the hardware performance. For in-house processor R&D, CPL can aid design verification (DV) by guiding verification coverage, providing configuration for testcases (TCs), and even revealing issues in early stage so that the architecture or microarchitecture of the processor can be changed for the better.

Meanwhile, CPL can also be integrated into a Resource Package (RP) in the form of libraries or standalone binaries to the downstream users of the processor.

Therefore, what is needed is a robust plugin framework for CPL to meet the multi-usage needs of CPL support of both DV and RP, while conserving resources.

SUMMARY

These shortcomings are addressed by the present disclosure of methods, computer program products, and systems for a compiler (CPL) plugin, for a special purpose processor for CPL-related DV test, optimized for providing dual compiler support of design verification and resource packaging.

In one embodiment, the CPL plugin comprises a TC to, responsive to a new DV test, read configuration settings and selects appropriate plugin processes based on the configuration settings. An API interface can generate images that control the special purpose processor during a stage of a plurality of stages for a CPL-related DV test and call selected plugin processes.

In another embodiment, a common compiler module comprising a common function codebase. A DV specialized support module comprising a DV function only codebase, wherein the DV has access to the common compiler module. An RP specialized support module can comprise an RP function only codebase, wherein the codebase is common for both DV and RP, and wherein top-level APIs are designed for both DV and RP. Responsive to completing the DV test, TC disables the plugins and injects traffic for the DV test, and wherein TC reports testing results.

Advantageously, computer performance is improved with more efficient compiling and conserving computer resources.

BRIEF DESCRIPTION OF THE DRAWINGS

In the following drawings, like reference numbers are used to refer to like elements. Although the following figures depict various examples of the invention, the invention is not limited to the examples depicted in the figures.

FIG. 1 is a high-level block diagrams illustrating a design verification system with dual support for CPL plugin during design verification and resource packaging, according to one preferred embodiment.

FIG. 2 shows sequence examples for API calls between RP and CPL, according to one embodiment.

FIG. 3 shows sequence examples for connections between DV and CPL, according to one embodiment.

FIG. 4 is a high-level flow diagram illustrating a method for providing a special-purpose processor with a compiler plugin optimized for dual support of design verification and resource packaging, according to one preferred embodiment.

FIG. 5 is a block diagram illustrating example commands to implement a TP, according to one embodiment.

FIG. 6 is a block diagram illustrating additional API calls, according to an embodiment.

FIGS. 7 and 8 are example pseudo code for implementing CPL, according to preferred embodiments.

DETAILED DESCRIPTION

The description below provides methods, computer program products, and systems for providing compiler support with a compiler plugin optimized for dual support of design verification and resource packaging.

One of ordinary skill in the art will recognize many additional variations made possible by the succinct description of techniques below. For example, a special-purpose network processor is referred to throughout merely for the sake of clarity and conciseness, although any type of special-purpose processor can be substituted under the techniques described herein. In other cases, a general-purpose processor implements the techniques.

I. Systems for Dual Support CPL Plugin (FIG. 1-2)

FIG. 1 is a high-level block diagram illustrating a system 100 for providing compiler support with a compiler plugin optimized for dual support of design verification and resource packaging, according to one embodiment. The compiler plugin framework includes a TC special purpose processor hardware design, an Application Programming Interface (API), a common compiler support module, a DV specialized support module, and an RP specialized support module. Hardware and software components can be implemented similar to the examples discussed below in section III concerning general computing embodiments.

In one embodiment, a plugin framework for CPL use the TC to, responsive to a new DV test, read configuration settings and selects appropriate plugin processes based on the configuration settings. The design verification test can support in-housed processor designs by providing configuration for testcases, and even revealing issues in the early state so that the architecture or microarchitecture of the processor can be changed for the better.

The API interface can generate images that control the special purpose processor during a stage of a plurality of stages for a CPL-related DV test and call selected plugin processes.

The common compiler module comprising a common function codebase. The DV specialized support module comprising a DV function only codebase, wherein the DV has access to the common compiler module.

The RP specialized support module can comprise an RP function only codebase, wherein the codebase is common for both DV and RP. The RP specialized support module integrates with the common compiler module because top-level APIs are designed for both DV and RP.

Responsive to completing the DV test, TC disables the plugins and injects traffic for the DV test. The TC reports testing results. The CPL system be implemented in part or fully FortiASIC and/or FortiOS software and devices developed by Fortinet of Sunnyvale, CA.

FIG. 1 illustrates the connections related to CPL design. The arrow directions represent the situation that a logic block at the starting point of the arrow can affect another logic block at the end point of the arrow. For example, CPL design (220) can affect the processor hardware design (210), and vice versa. CPL design can also affect design spec (200), although it is based on the spec.

Among all the blocks shown in FIG. 1, DV (230) and RP (240) are the ones that use CPL most often, and a substantial portion of CPL logic is shared by both DV and RP. Hence, it works best for CPL to maintain a single codebase, and provides support to both DV and RP.

However, for CPL, the DV package requires a different set of features than RP. RP is often performance sensitive, which requires smaller memory footprint, faster execution speed, and only limited built-in debug information. DV needs all design features to be tested. It often runs on a server which has less concern about memory space, CPU resources, and storage capacity. The most important requirement for DV is to run through valid testcases, including corner cases, and reveal bugs and design flaws.

Problematically, a CPL that only carries the essential functionalities can be used by RP through well-designed APIs.

An example of the API calls between RP and CPL is illustrated in FIG. 2. The APIs can be provided by RP or CPL. Some commonly used APIs provided by CPL are init (initialization), deinit (termination), different types of proc (procedure call), etc. A common API provided by RP is cb (callback).

However, in order to use this CPL codebase for DV, these APIs are insufficient to meet the requirement of all the testcases. The possible connections between DV and CPL are illustrated in FIG. 3. DV has many testcases (TCs, 320), each possibly visiting one or more tapping points (TPs, 310) in CPL. Similarly, each TP can be visited by one or more TCs in DV. The connections between TCs and TPs depend on testcase requirements and it is difficult for a set of pre-defined APIs to meet the needs.

Conventionally, to enhance debug visibility in DV, while allowing to sacrifice some speed and to loosen memory footprint slightly within reasonable range, one may rebuild CPL codebase with different compilation flags, which include but are not limited to, built-in flags (such as –O0 or –O3 for GCC), or user-defined flags (such as C macros for settings), after implementing a TP.

However, compilation flags are not flexible enough to make CPL codebase to support DV and RP equally well. Under myriad scenarios, DV and RP have different needs regarding the granularity of internal steps. Built-in flags can change the embedded debug information and the level of binary optimization, but are hardly capable of tapping into details behind an API. User-defined flags can enable or disable functions or logic flows during compilation, but also create extra maintenance effort when the program evolves. A newly added flag may introduce bugs because of the interactions with other existing flags. If the maintainer tries to test all the combinations of user-defined flags, the complexity of the test itself is $O(2^n)$, if n flags exist, and each flag has 2 possible values, which is a common case of ifdef macro in C/C++. In addition, in a big project, DV and CPL belong to different team and the majority of the functionality of a TP is better separated from the CPL codebase and maintained by the DV team.

More generally, the CPL design and verification system 100 operates under constraints of the verification process. Some example constraints of preferred embodiments include (1) CPL maintains only one codebase for DV and RP; (2) top level APIs of CPL are designed for RP as well as DV; (3) the functions carrying out the workload only for RP should stay in RP codebase, not in CPL codebase; (4) the functions carrying out the workload only for DV should stay in DV codebase, not in CPL codebase; and (5) DV can tap into CPL without breaking up CPL functionality or requiring CPL rebuild. It only requires minimal update on CPL. These assumptions can be the testing and development requirements of when integrating CPL functionality in DV and RP process.

As a result, constraint (1) optimizes the maintenance cost of CPL, since bug fixes and functionality updates in CPL immediately take effect in DV and RP which use this CPL. Constraint (2) requires a set of carefully designed APIs that are easy to use. Meanwhile they hide details of CPL from its caller, DV or RP. Constraints (3) and (4) prevent the codebase of CPL from unnecessary expansion that can cause confusion of tasks and responsibilities of DV and RP, introduce bugs to both, reduce the code efficiency, and increase maintenance costs. Constraint (5) gives DV a high-resolution visibility of CPL, when DV needs to visit internal status and variables of CPL. Many of these details are invisible to RP by design. The constraints can be parameters set by the system in various implementations.

Advantageously, CPL design works seamlessly with special-purpose processors

II. Methods for Dual Support CPL Plugin (FIGS. 4-8)

FIG. 4 is a high-level flow diagram illustrating a method for providing compiler support with a compiler plugin optimized for dual support of design verification and resource packaging, according to one embodiment. The method 400 can be implemented, for example, by the system 100 of FIG. 1. The steps are merely representative groupings of functionality, as there can be more or fewer steps, and the steps can be performed in different orders. Many other variations of the method 400 are possible.

In FIG. 4, the flowchart of an example of CPL-related DV test is given. At the beginning of the test, TC reads configuration file settings, based on the which, it enables CPL plugin(s) in a way that suits this specific test. Then CPL runs through multiple stages to generate images that control the processor. Within each stage, CPL may or may not encounter a valid plugin. If it sees a valid plugin, a plugin proc is called, which returns some information that TC will use later on when configuring the traffic injection and reporting results. When CPL completes the final stage, TC disables the plugin(s) which has been enabled before. Then TC sends traffic for the DV test and reports the testing results.

The first step for the plugin framework is focused on TP (310) in FIG. 5. We separate TP into two parts, TP_obj (420) and TP_ptr (410), as shown in FIG. 5. TP_obj is the object which provides the information needed by TC (320), and is maintained by DV. It carries out tasks as simple as printing out certain debugging information in TC's interests, or as complex as a new algorithm to set up configuration for TC, which is independent of CPL's normal functionality. TP_ptr is a variable to provide the address for CPL to know where to find the corresponding TP_obj. There are multiple ways to implement TP_ptr, including but not limited to, a pointer which can be valid or invalid. For example, in C, a null pointer is invalid, and if TP_ptr is not a null pointer, it is programmed to point to a TP_obj by holding its address.

In order to achieve good flexibility, a TP_obj can be mapped to one or more TP_ptr(s), as long as they reuse the same functionality of the TP. Meanwhile, a TP_ptr can point to a different TP_obj if request by a different TC.

An example of components of TP_obj is shown in FIG. 6. It has a common structure, TP_common (510), which includes, but is not limited to these fields, id, name, and obj_ptr, which represent the unique ID number for the TP, the TP's name, and a pointer to the object in CPL that activates this TP, respectively. In addition to the common structure, a procedure (proc) specifically working for this TP_obj, by accepting a set of arguments (args) and processing the information provided by CPL, is also part of the TP_obj.

In order to pass the information from CPL to TP, a distributor, TP_dist (520), is also shown in FIG. 6. TP_dist extracts id based on TP_ptr and use this id to distribute the task to the correct proc carried by the corresponding TP_obj. The pseudo code of TP_dist and CPL call via TP_ptr is given in FIG. 7.

For each TC that talks with a TP, it needs to engage this TP, by calling TP_enable(obj_ptr, id). After the process is finished, TP_disable(id) is called to disengage this TP. When TP_enable is called, obj_ptr carries the address of a module or sub-module of CPL, which can be given by CPL itself, or even more non-intrusively, be deducted from a related object previously known to the framework. The pseudo code of TP_enable and TP_disable is shown in FIG. 8. As mentioned before, if it is written in C, disabling a pointer in TP_disable just needs to set its value to null. If it is in some other programming language, we can set it to a predefined invalid value.

Returning again to the (5) example constraints of the DV process, the CPL codebase has both top level APIs for RP and DV (constraint 2), as shown in FIG. 2. In addition to this, CPL adds TP_ptr support (FIG. 5), which is just a lightweight conditional check (whether TP_ptr is valid) and does not affect RP performance in any significant way. Therefore, the CPL codebase can work for RP as well as DV. Assumption 1 holds.

As RP only calls CPL through APIs, and does not know details of CPL, constraint 3 naturally holds. In FIG. 5, the plugin framework separates TP_ptr from TP_obj and DV is responsible for the maintenance of the latter, with the help of TP_dist (520) in FIG. 6, which is also maintained by DV. Thus constraint 4 holds.

Every time when DV needs a new TP_obj, TP_enable and TP_disable will be called, which do not have to be done by CPL. CPL only needs to add the TP_ptr check and TP_dist call as indicated in FIG. 7.

If DV makes an update on proc in an existing TP_obj by changing args, CPL just needs to change args accordingly (in FIG. 7). The implementation of proc is completely transparent to CPL. When DV becomes more mature overtime, a change of args happens less often. Assumption 5 also holds.

By taking the (5) example constraints into consideration, our CPL plugin framework is capable of supporting both RP and DV with the same codebase, and achieving great flexibility for DV testcases. The CPL plugin framework also opens the door for potential extended usage of CPL in the future which is not required by RP.

III. Generic Computing Device

The special processor discussed herein can operate within a computing device such as a network computing device. Other examples can be a mobile computing device, a laptop device, a smartphone, a tablet device, a phablet device, a video game console, a personal computing device, a stationary computing device, a server blade, an Internet appliance, a virtual computing device, a distributed computing device, a cloud-based computing device, or any appropriate processor-driven device.

The computing device can can include a memory, a processor, a storage drive, and an I/O port. Each of the components is coupled for electronic communication via a bus. Communication can be digital and/or analog, and use any suitable protocol.

The memory further comprises network applications and an operating system. The network applications 612 can include a web browser, a mobile application, an application that uses networking, a remote application executing locally, a network protocol application, a network management application, a network routing application, or the like.

The operating system can be one of the Microsoft Windows® family of operating systems (e.g., Windows 96, 98, Me, Windows NT, Windows 2000, Windows XP, Windows XP x64 Edition, Windows Vista, Windows CE, Windows Mobile, Windows 6 or Windows 8), Linux, HP-UX, UNIX, Sun OS, Solaris, Mac OS X, Alpha OS, AIX, IRIX32, IRIX64, or Android. Other operating systems may be used. Microsoft Windows is a trademark of Microsoft Corporation.

The processor can be a network processor (e.g., optimized for IEEE 802.11, IEEE 802.11AC or IEEE 802.11AX), a general purpose processor, an application-specific integrated circuit (ASIC), a field programmable gate array (FPGA), a reduced instruction set controller (RISC) processor, an integrated circuit, or the like. Qualcomm Atheros, Broadcom Corporation, and Marvell Semiconductors manufacture processors that are optimized for IEEE 802.11 devices. The processor can be single core, multiple core, or include more than one processing elements. The processor can be disposed on silicon or any other suitable material. The processor can receive and execute instructions and data stored in the memory 610 or the storage drive.

The storage drive can be any non-volatile type of storage such as a magnetic disc, EEPROM (electronically erasable programmable read-only memory), Flash, or the like. The storage drive 630 stores code and data for applications.

The I/O port further comprises a user interface 642 and a network interface. The user interface can output to a display device and receive input from, for example, a keyboard. The network interface (e.g. RF antennae) connects to a medium such as Ethernet or Wi-Fi for data input and output.

Many of the functionalities described herein can be implemented with computer software, computer hardware, or a combination.

Computer software products (e.g., non-transitory computer products storing source code) may be written in any of various suitable programming languages, such as C, C++, C#, Oracle® Java, JavaScript, PHP, Python, Perl, Ruby, AJAX, and Adobe® Flash®. The computer software product may be an independent application with data input and data display modules. Alternatively, the computer software products may be classes that are instantiated as distributed objects. The computer software products may also be component software such as Java Beans (from Sun Microsystems) or Enterprise Java Beans (EJB from Sun Microsystems). Some embodiments can be implemented with artificial intelligence.

Furthermore, the computer that is running the previously mentioned computer software may be connected to a network and may interface with other computers using this network. The network may be on an intranet or the Internet, among others. The network may be a wired network (e.g., using copper), telephone network, packet network, an optical network (e.g., using optical fiber), or a wireless network, or any combination of these. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, 802.11n, and 802.11ac, just to name a few examples). For example, signals from a computer may be transferred, at least in part, wirelessly to components or other computers.

In an embodiment, with a Web browser executing on a computer workstation system, a user accesses a system on the World Wide Web (WWW) through a network such as the Internet. The Web browser is used to download web pages or other content in various formats including HTML, XML, text, PDF, and postscript, and may be used to upload information to other parts of the system. The Web browser may use uniform resource identifiers (URLs) to identify resources on the Web and hypertext transfer protocol (HTTP) in transferring files on the Web.

The phrase "network appliance" generally refers to a specialized or dedicated device for use on a network in virtual or physical form. Some network appliances are implemented as general-purpose computers with appropriate software configured for the particular functions to be provided by the network appliance; others include custom hardware (e.g., one or more custom Application Specific Integrated Circuits (ASICs)). Examples of functionality that may be provided by a network appliance include, but is not limited to, Layer 2/3 routing, content inspection, content filtering, firewall, traffic shaping, application control, Voice over Internet Protocol (VoIP) support, Virtual Private Networking (VPN), IP security (IPSec), Secure Sockets Layer (SSL), antivirus, intrusion detection, intrusion prevention, Web content filtering, spyware prevention and anti-spam. Examples of network appliances include, but are not limited to, network gateways and network security appliances (e.g., FORTIGATE family of network security appliances and FORTICARRIER family of consolidated security appliances), messaging security appliances (e.g., FORTIMAIL family of messaging security appliances), database security and/or compliance appliances (e.g., FORTIDB database security and compliance appliance), web application firewall appliances (e.g., FORTIWEB family of web application firewall appliances), application acceleration appliances, server load balancing appliances (e.g., FORTIBALANCER family of application delivery controllers), vulnerability management appliances (e.g., FORTISCAN family of vulnerability management appliances), configuration, provisioning, update and/or management appliances (e.g., FORTIMANAGER family of management appliances), logging, analyzing and/or reporting appliances (e.g., FORTIANALYZER family of network security reporting appliances), bypass appliances (e.g., FORTIBRIDGE family of bypass appliances), Domain Name Server (DNS) appliances (e.g., FORTIDNS family of DNS appliances), wireless security appliances (e.g., FORTIWIFI family of wireless security gateways), FORIDDOS, wireless access point appliances (e.g., FORTIAP wireless access points), switches (e.g., FORTISWITCH family of switches) and IP-PBX phone system appliances (e.g., FORTIVOICE family of IP-PBX phone systems).

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

We claim:

1. A design verification test system comprising a compiler (CPL) plugin to, in a network processor, execute a CPL-related design verification test, while maintaining dual compiler support of design verification (DV) and resource packaging (RP), the CPL plugin comprising:
    a testcase (TC) to, responsive to a new DV test, read configuration settings and select appropriate plugin processes based on the configuration settings;
    an API interface, to generate images that control the special-purpose processor during a stage of a plurality of stages for the new DV test and call the selected plugin processes;
    a common compiler module comprising a common function codebase with top-level APIs;
    a DV specialized support module comprising a DV function only codebase, wherein the DV has access to the common compiler module; and
    an RP specialized support module comprising an RP function only codebase, wherein the RP function only codebase is common for both DV and RP, and wherein the top-level APIs are designed for both DV and RP,
    wherein, responsive to completing the new DV test, the TC disables the selected plugin processes and injects traffic for the DV test, and wherein TC reports testing results.

2. The CPL plugin of claim 1, wherein the special-purpose processor is disposed within a network device.

3. The CPL plugin of claim 1, wherein at least a portion of the compiler is implemented in microcode.

4. The CPL plugin of claim 1, wherein the design verification test system interoperates with a specialized driver for networking.

5. The CPL plugin of claim 1, wherein the design verification test system comprises a system on a chip (SOC).

6. The CPL plugin of claim 1, wherein the special-purpose processor comprises an ASIC for networking.

7. A method in a special-purpose processor, for executing a compiler (CPL)-related design verification (DV) test, while maintaining dual compiler support of DV and resource packaging (RP), the method comprising the steps of:
    detecting a new DV test;
    responsive to the new DV test, reading configuration settings to a TC and selecting appropriate plugin processes based on the configuration settings;
    generating images that control the special purpose processor, by an API interface, during a stage of a plurality of stages for a CPL-related DV test and call selected plugin processes;
    wherein, a common compiler module comprises a common function codebase, a DV specialized support module comprises a DV function only codebase, wherein the DV has access to the common compiler module; an (RP) specialized support module comprises an RP function only codebase, wherein the codebase is common for both DV and RP, and wherein top-level APIs are designed for both DV and RP, and responsive to completing the DV test, disabling the plugins, injecting traffic and reporting results for the DV test, by the TC, and responsive to completing the DV test, disabling the plugins, injecting traffic and reporting results for the DV test, by the TC.

8. A non-transitory computer-readable media for, when executed by a special-purpose processor, for executing a CPL-related design verification (DV) test, while maintaining dual compiler support of design verification and resource packaging, the method comprising the steps of:

detecting a new DV test;

responsive to the new DV test, reading configuration settings to a TC and selecting appropriate plugin processes based on the configuration settings;

generating images that control the special purpose processor, by an API interface, during a stage of a plurality of stages for a CPL-related DV test and call selected plugin processes;

wherein, a common compiler module comprises a common function codebase, a DV specialized support module comprises a DV function only codebase, wherein the DV has access to the common compiler module; a resource packaging (RP) specialized support module comprises an RP function only codebase, wherein the codebase is common for both DV and RP, and wherein top-level APIs are designed for both DV and RP, and responsive to completing the DV test, disabling the plugins, injecting traffic and reporting results for the DV test, by the TC, and responsive to completing the DV test, disabling the plugins, injecting traffic and reporting results for the DV test, by the TC.

9. The CPL plugin of claim 1, wherein a TP comprises a TP object which provides information needed by TC, and a TP pointer which is a variable to provide an address for the CPL plugin to find the TP object.

10. The CPL plugin of claim 1, wherein the TC engages the TP with a call to TP enable and disengages the TP with a call to TC disable.

11. The CPL plugin of claim 1, wherein the CPL plugin maintains only one codebase for DV and RP.

12. The CPL plugin of claim 1, wherein APIs of the CPL plugin are designed for both DV and RP.

13. The CPL plugin of claim 1, wherein functions carrying out workload only for DV should be maintained in a DV database and not in a CPL database.

14. The CPL plugin of claim 1, wherein functions carrying out workload only for RP should stay in an RP database and not in a CPL database.

15. The CPL plugin of claim 1, wherein the DV taps into the CPL plugin without breaking up CPL functionality or requiring CPL rebuild.

\* \* \* \* \*